United States Patent [19]
Bartush et al.

[11] Patent Number: 4,470,874
[45] Date of Patent: Sep. 11, 1984

[54] PLANARIZATION OF MULTI-LEVEL INTERCONNECTED METALLIZATION SYSTEM

[75] Inventors: Thomas A. Bartush; Garth A. Brooks, both of Wappingers Falls; James R. Kitcher, Poughkeepsie, all of N.Y.

[73] Assignee: International Business Machines Corporation, Armonk, N.Y.

[21] Appl. No.: 561,778

[22] Filed: Dec. 15, 1983

[51] Int. Cl.³ .................. B44C 1/22; C03C 15/00; C03C 25/06; C23F 1/02
[52] U.S. Cl. .................. 156/643; 156/646; 156/651; 156/653; 156/659.1; 156/656; 204/19 ZE
[58] Field of Search ............ 156/643, 646, 651, 652, 156/653, 657, 656, 659.1, 662; 252/79.1; 427/38, 39; 204/19 ZE

[56] References Cited

U.S. PATENT DOCUMENTS

| | | |
|---|---|---|
| 3,804,738 | 4/1974 | Lechaton et al. ............. 204/192 |
| 3,983,022 | 9/1976 | Auyang et al. .............. 204/192 |
| 3,985,597 | 10/1976 | Zielinski ..................... 156/11 |
| 4,004,044 | 1/1977 | Franco et al. ............... 427/43 |
| 4,367,119 | 1/1983 | Logan et al. ................ 156/643 |

OTHER PUBLICATIONS

IBM Technical Disclosure Bulletin, vol. 19, No. 9, Feb. 1977, Forming Planar Integrated Circuit Metallization, W. C. Metzger et al., pp. 3364–3365.
IBM Technical Disclosure Bulletin, vol. 20, No. 8, Jan. 1978, Reducing Interlevel Shorts in Sputtered Insulators, H. M. Gartner et al., p. 3076.
IBM Technical Disclosure Bulletin, vol. 20, No. 4, Sep. 1977, "Sidewall Tailoring Using Two Different Reactive Ion Etchants in Succession", p. 1388.
IBM Technical Disclosure Bulletin, vol. 23, No. 9, Feb. 1981, "Dual Dielectric for Multilevel Metal", by T. A. Bartush, p. 4140.

*Primary Examiner*—William A. Powell
*Attorney, Agent, or Firm*—Henry Powers

[57] ABSTRACT

The planarization of structures having vertical interconnection studs embedded in an insulator layer utilizing a resist layer with dry etching in a $CF_4$ ambient for equal etching of resist and the insulation to planarize the insulation, followed by dry etching in essentially a noble gas (argon) ambient for equal etching of the insulator layer and stud metal to desired planarization.

32 Claims, 8 Drawing Figures

PLANARIZATION OF MULTI-LEVEL INTERCONNECTED METALLIZATION SYSTEM

BACKGROUND OF THE INVENTION

1. Field of the Invention

This invention relates to a process for forming embedded metallurgy patterns on a substrate, and more particularly to the fabrication of semiconductor devices employing a process for forming an interconnection metallurgy system embedded in the passivating layer with a planar top surface.

2. Description of the Prior Art

The forming of an interconnection metallurgy system for integrated circuit devices has conventionally been done by blanket depositing a metal layer, forming a photoresist layer on the metal layer, exposing the resist to the desired metallurgy pattern, developing the resist, and subsequently etching the exposed portions of the underlying metal layer to thereby form the interconnection metallurgy system. The pattern was subsequently covered by an insulating layer and another metallurgy pattern formed over same, making contact to the underlying layer through via holes, until the desired interconnection metallurgy system was complete. However, with continued miniaturization of semiconductor integrated circuits to achieve greater component density particularly in large scale integrated circuitry, the metallurgy was made smaller and more dense. The planarity of the surface of the system became a serious consideration in the fabrication of interconnecting systems. Each time a metallurgy pattern is deposited on a surface, the more irregular or non-planar the surface of the overlying insulating layer becomes. In general, after three levels of metallurgy have been deposited, the surface becomes so irregular that additional layers cannot be deposited properly. The irregular surface presents two very important problems which have a direct bearing on the yield and reliability of the resultant system. When a layer of metal is deposited over an irregular surface, the resultant layer becomes thinner over a step portion of the supporting layer. This thinned down portion results in current crowding and possible failure due to electromigration. A further problem is concerned with forming the resist pattern. Clear, distinct exposure and development becomes impossible as the surface becomes more irregular.

One particular processing stage which contributes to the problem of non-planarity is the application of insulating or passivating coatings over surface metallurgy. In these processing stages, the passivating film has been found to follow the contour of the deposited conductor pattern. In other words, a line in the conductor or metallization pattern will result in a corresponding elevation in the covering insulative or passivating layer over the metallization pattern. In integrated circuits having multi-levels of metallization, the cumulative effect of such elevations in the insulation layers is highly undesirable.

For example, a line in the metallization pattern may result in a corresponding elevation in the covering dielectric layer over the metallization pattern. Then, after a subsequent level metallization pattern is deposited onto the covering layer and it, in turn, covered by an additional insulative layer, the upper surface of the additional covering layer will display the cumulative effects of both underlying metallization patterns. In such cases, a "skyscraper" effect results wherein the cumulative metallic lines produce pronounced elevations which render the surface of an uppermost insulative layer so irregular, that the metallization lines deposited over such a layer extend over a very bumpy surface. This tends to produce discontinuities in the metal lines.

In addition, in such structures, it is difficult to design a structure in which a via hole through a given covering layer of dielectric material to an underlying metallization line may be made with consistent control so as to avoid over-etching through the insulative layer under the metallization, thereby shorting out the conductive line through its underlying insulation.

The problems with such elevation and irregularity in integrated circuit levels are discussed in detail in U.S. Pat. No. 3,804,738.

In the prior art, a number of approaches have been proposed for lowering the elevations or steps in such insulative layers, to, thereby, planarize the surface. One approach, as is described in U.S. Pat. No. 3,983,022, and involves resputtering ("sputter polishing") of the elevations.

Although this approach has been effective in planarizing elevations of relatively narrow widths, it is relatively time-consuming. In fact, the time factor becomes so pronounced that the resputtering approach becomes relatively burdensome where the elevations or steps are relatively wide.

Another approach involves masking the depressed areas or valleys with an etch-resistant material such as photoresist through conventional photolithographic techniques, and then etching to remove the uncovered elevations or steps. This approach often runs into problems with photoresist mask alignment. In high density large scale integrated circuits, the dimensions are so minute that difficulties may be encountered in obtaining the exact registration required to completely mask the depressed areas or valleys with photoresist. Any misalignment which leaves a portion of a depressed area exposed could result in an etch through the insulative layer in said depressed area simultaneously with the planarization of the elevated area. This will result in an undesirable short circuit path through the insulative layer in the depressed area.

A further approach of special interest is that disclosed by J. J. Calocino and T. A. Bartush in the IBM-TDB article "Removal of Quartz Spikes Over Metal Lands", page 1381, Vol. 20, No. 4, September 1977. In this approach, surface variations in the form of quartz spikes formed over metallization patterns in quartz layers are planarized by coating the quartz layer with a suitable resist, such as a diazoquinone/novolak resist (eg. Shipley's AZ1350J) and reactive ion etching in an ambient mixture of $CF_4$ (92%) and oxygen (8%) which will produce an etch ratio of about 1/1 between the resist and the quartz. When the planar removal of the resist reaches the quartz spikes, both are removed concurrently (at substantial equal rates) until planarization of the quartz is obtained. Thereafter "via holes are then opened using a patterned resist layer". As can be seen, the technique provides no solution to the planarization of substrate surface variations due to vertical displacements of both, the insulator layer and the conductor or metallization pattern.

SUMMARY OF THE INVENTION

It has been discovered, in accordance with this invention, that the above Colacino and Bartush process can be adapted to forming a completely planarized device by retaining the CF$_4$ (with or without O$_2$) reactive ion etch-back to exposure of the top surfaces of the higher upstanding interconnecting segments or studs on a conductor pattern.

However, drawbacks occur with a total CF$_4$ etch back, in that since only the insulator material is removed, metallization located on substrate feature variations (such as recessed oxide insulator bird's beak and/or other raised surface variation) will protrude above the insulator. This occurs because overetch is needed to reveal the lower conductor portion. Often these height variations may be as much as 7000 Å, and the condition is exacerbated by the over etch required to compensate for non-uniformities in the insulator (eg. quartz, SiO$_2$, etc.) layer and the metallization (eg. AlCu alloy) deposition and the reactive ion etch process itself.

It was further found that a solution to these potential problems can be effected by the use of an abbreviated CF$_4$ etch-back, to remove the insulator (quartz) peaks, followed by ion milling or an Argon (Ar+) sputter polish step which remove both the insulator and metal at substantially the same etch rate, and thus provide a more planar structure. This process is amenable to compensating for thinning of the insulator (quartz, SiO$_2$, etc.) layer during etch-back, for exposure of interconnecting stud structure, as in U.S. Pat. No. 4,367,119 and the Bartush IBM-TDB, page 4140, Vol. 23, No. 9, February 1981, by increasing both the initial height of the "stud" and the insulator thickness, and keeping the total etch-back constant, so that there will be a net gain in the insulator thickness.

Accordingly, it is one object of this invention to provide a novel process for forming passivated metal interconnection systems having surface planarity.

Another object of the present invention is to provide a novel process for forming multi-level and interconnected metallurgical conductor systems with surface planarity.

It is another object of this invention to provide a novel process for planarizing vertical surface variations in multi-level conductor patterns of semiconductor devices, due to surface vertical displacement of the top surfaces of interconnecting studs and covering insulator layers.

BRIEF DESCRIPTION OF THE DRAWINGS

In the accompanying drawings forming a material part of this disclosure:

FIGS. 2A to 5A are similar views to contrast the advantage of the invention of this invention with modified processing.

DESCRIPTION OF THE PREFERRED EMBODIMENTS

Figure 1:
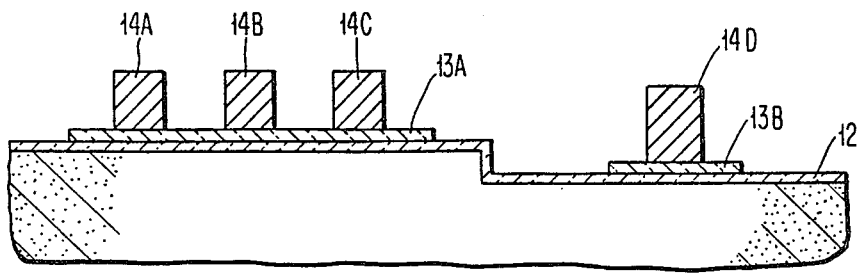
FIGS. 1 to 4 show a sequence of elevational views, in cross-section, illustrating a substrate at various stages of fabrication utilizing the concept of this invention.

Referring now to the drawings and in FIG. 1 in particular, there is disclosed a substrate 10 which is typically monocrystalline silicon or other semiconductor material with an overlying layer 12 of a dielectric layer, as for example SiO$_2$. The substrate 10 in the preferred embodiment of the process of the invention is an integrated circuit device having active and passive devices fabricated therein (not shown) and means for electrically isolating the devices from each other. In this application, layer 12 is provided with contact openings (not shown) for making contact to the active and passive devices. The substrate could also be a body of insulating material when the process is used to form metallurgy on a module for supporting integrated circuit devices and appropriate associated circuitry.

Formed on the dielectric layer 12 are segments 13A and 13B of a conductive metallurgical system which may constitute one level of a multi-level conductor system such as shown in U.S. Pat. Nos. 3,985,597 and 4,367,119. The metallization pattern (eg. 13A, 13B, etc.) may be any conventional metal or alloy used in integrated circuits, such as aluminum, aluminum-copper alloys, etc., which may be deposited by any conventional method such as by evaporation.

Similar metallization may be employed for deposition of interconnecting conductive studs 14A to 14C on conductive pattern segment 13A, and the conductive stud 14D on pattern segment 13B. For purpose of illustrating the scope of this invention, the substrate 10, with its overlying dielectric layer 12, is shown with a stepped portion 15 for depicting a non-uniformity in the substrate topography. As a result, the top surface of the stud 14D will be vertically displaced relative to the top surfaces of the studs 14A to 14C. In other words, the top surface of stud 14D will extend in a plane below the plane in which the top surfaces of studs 14A to 14C extend. Also, as will be obvious, the vertical displacement of the top surfaces of the studs can result from variation in the vertical heights of the studs.

Although the conductor pattern segment 13A and 13B with their projecting interconnecting studs, are shown as deposited on and extending from the dielectric layer 12, it is to be understood, that the metallization can be partially or fully embedded within supplementing insulation. For example, if the conductor pattern segments 13A and 13B are formed by the lift-off process of U.S. Pat. No. 4,004,044, they would be first embedded in a coextending layer of insulation (e.g., quartz, SiO$_2$, etc.) before repetition of the process steps of this patent as illustrated in its's FIGS. 1A-1H, to form the interconnecting studs 14A to 14D.

In any event, the substrate structure is then coated with a supplementing insulating layer 15 by any known method, as for example, quartz or silicon dioxide by cathode sputtering. As is pointed out, the contour of the insulating or dielectric layer 15 will essentially follow the contour of the conductive segments 13A and 13B and other associated conductive studs 14A to 14D.

Although not required, where a duel dielectric is desired, the substrate structure can be first coated (prior to formation of insulator layer 15) with an under-layer 17 of silicon nitride by any suitable sputtering technique such as sputtering or plasma enhanced chemical vapor deposition. Although, the thickness of the nitride is not critical, it can be effectively applied in a thickness of about 0.1 microns to about 0.6 microns. In this regard, other typical dimensions for the layers of FIG. 2 can be from about 0.5 to about 2.0 microns for the thickness of conductor pattern layer segments 13A and 13B; from about 1.0 to about 3.0 microns for the height of interconnecting studs 14A to 14B; and from about 1.5 to about 4.0 microns for the thickness of insulating layer 15 relative to the planes of the adjacent underlying elements. (In practice the insulation thickness equals the sum of the metal thickness 13A, 13B plus 14A,B,C.)

Figure 2:
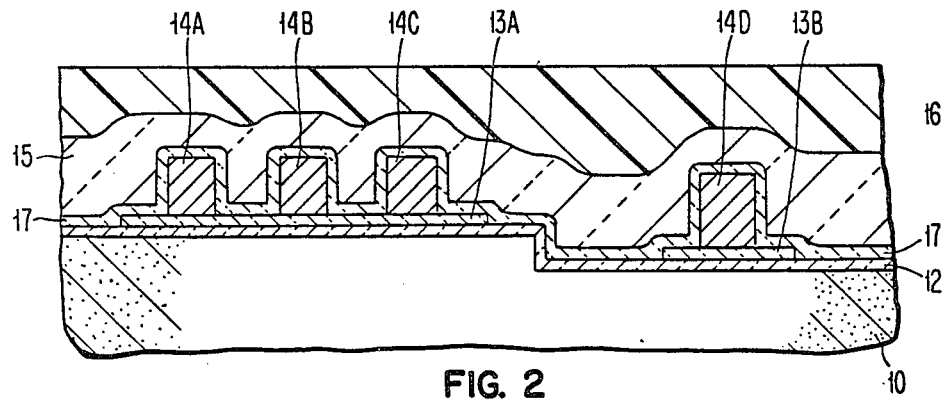

Next, as shown in FIG. 2 and indicated above, a photoresist layer is blanket coated on the substrate structure to form a planar photoresist layer 16. Any suitable resist can be employed which provides a substantially 1 to 1 etch ratio with the insulating layer 15 in the ambients employed. For example, where silicon dioxide or quartz are used for the insulator layer 15, a diazoquinone/novolak resist (e.g., Shipley's AZ-1305J) can be used for the planarization of the structure in an ambient of $CF_4$ or $CF_4+O_2$ flowing at 20-30 SCCM (Standard Cubic Centimeters), a power of 270-320 watts (power density ~0.2-0.4 watts/$cm^2$), and a pressure of 25-30 microns.

Figure 2A:
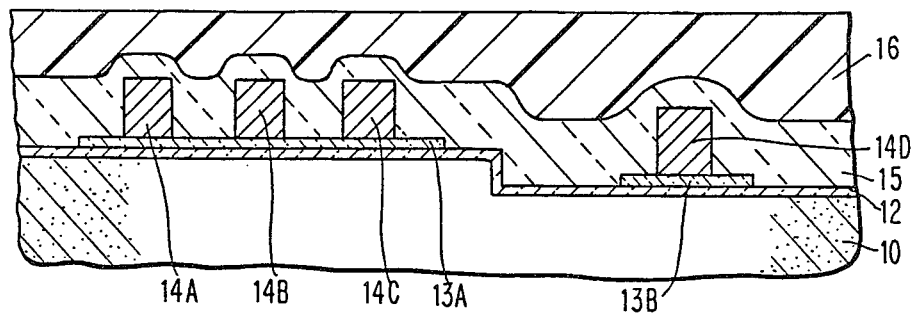

FIG. 2A shows a similar substrate structure without the interposed under layer 17, and also employed to illustrate the undesirability of a process variation which would normally be followed in contrast to this invention.

Figure 3:
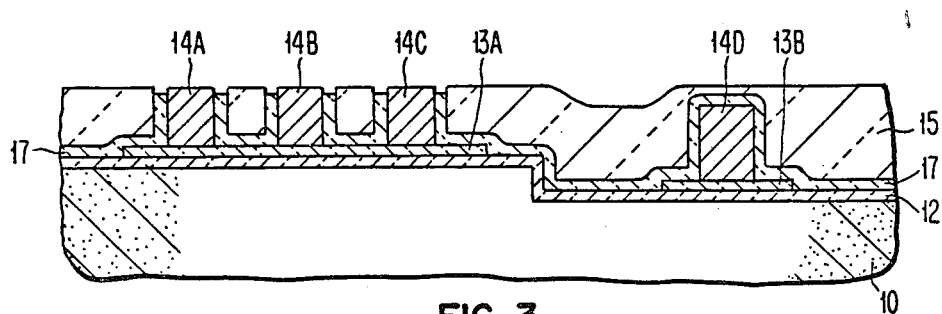
Figure 4:
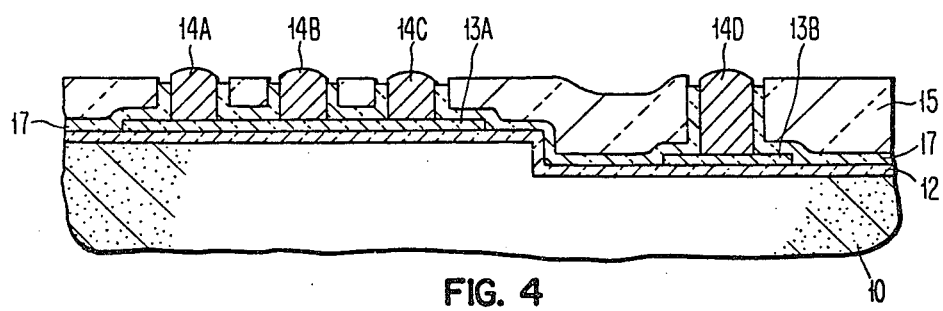

During the etching operation, since the resist layer 16 is planar, it will be removed uniformly until the elevations of the insulator layer 15 are reached, at which time the quartz will be removed at the substantially the same rate, with the etching continuing until the top surfaces of the higher elevated interconnecting studs 14A to 14C are exposed, as shown in FIG. 3.

At this point the ambient can be switched to essentially an argon ambient with a flow rate of 50-100 SCCM, at a pressure of 15-30 microns and a power of 2000 watts, (power density $\cong$0.8-1.2 watts/$cm^2$) to etch-back the insulator layer (quartz) 15 and the metallic (aluminum-copper) studs 14A to 14C at substantially the same rate, and the etching continued until the top surface of stud 14D is exposed in a common plane with the top surfaces of insulator layer 15 and studs 14A to 14C. As will be appreciated, although sputter etching has been referred to, alternative processing, such as ion milling and polishing can also be employed.

Figure 3A:
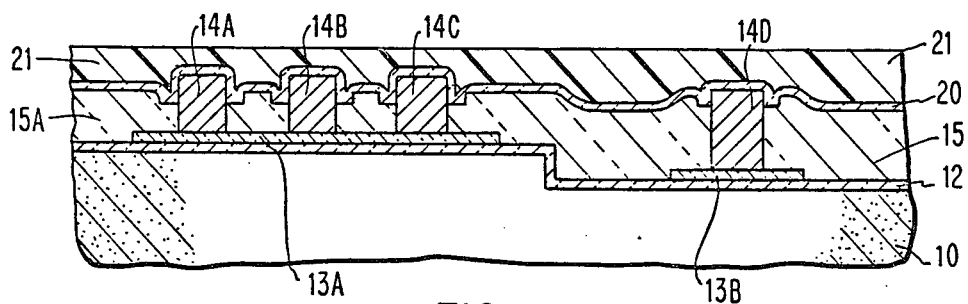
Figure 4A:
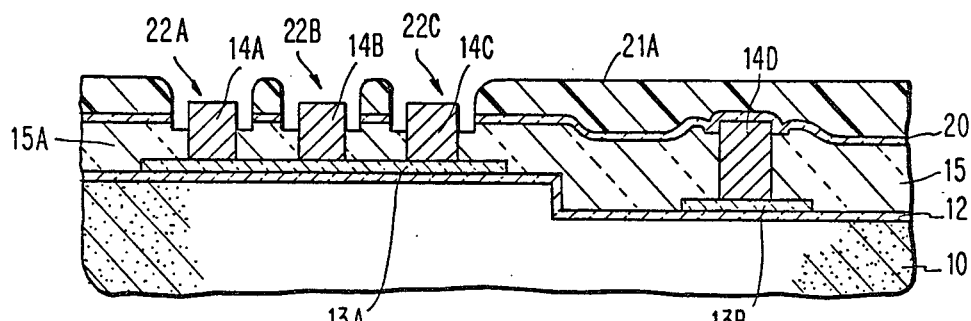
Figure 5A:
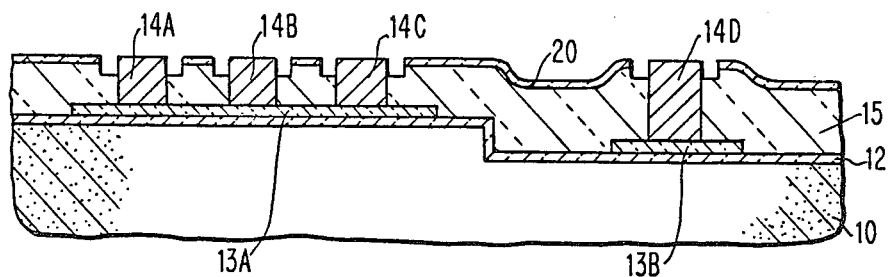

In contrast with respect to FIG. 3A, shown there is the resultant structure if etching of the substrate is continued in an $CF_4$ (alone or with $O_2$) until the lower top surface of stud 14D is exposed. This approach will result in studs 14A to 14C protruding above the plane of etched-back insulator layer 15. As a result, additional processing steps are involved, such as coating the substrate with a silicon nitride layer 10, followed by an overcoating of a resist layer 21, which is processed into a resist mask 21 which maintains the lower stud 14D covered, but having openings defining access vias 22A to 22C over respective studs 14A to 14C, followed by etching of the exposed portions of silicon nitride layer 20, and etch-back of interconnecting studs 14A to 14C to the top surface plane of etch-back insulator layer 15A. FIG. 5A shows the final substrate structure after stripping of the resist mask 21A.

As will be appreciated, the invention of this application, as defined in the claims, compensates for variation in stud heights during planarization, which also eliminates a masking step (as in the above-described process variation).

While the invention has been particularly shown and described with reference to preferred embodiments thereof, it will be understood by those skilled in the art that the foregoing and other changes in form and detail may be made without departing from the spirit and scope of the invention.

What is claimed is:

1. A method for fabricating interconnection stud structures on a substrate having formed on an insulated surface thereof a conductive metallic pattern interconnected to internal circuits in said substrate through via openings in said surface comprising:
   (A) forming at least one conductive vertical stud on said surface;
   (B) blanket depositing a dielectric layer on said surface to imbed said pattern and said stud;
   (C) blanket coating a resist layer on said dielectric layer;
   (D) dry etching said substrate in an ambient providing substantially equal etch rates for said dielectric and resist layers, and continuing said etching to remove said resist layer concurrently with planarization of said dielectric layer; and
   (E) dry etching said substrate in an ambient providing substantially equal etch rates for said dielectric layer and said studs, and continuing second said etching to expose the top surface of each said stud in a substantially common plane with said dielectric layer.

2. The method of claim 1 wherein Step A comprises the formation of at least two of said studs having the top surfaces thereof extending in respective vertically displaced planes relative to said surface.

3. The method of claim 2 wherein said dielectric comprises quartz, and said pattern and each of said studs comprise on aluminum-based alloy.

4. The method of claim 3 including the step of blanket coating said substrate pattern and each said stud with silicon nitirde between Steps A and B.

5. The method of claim 1 wherein said dielectric comprises quartz, and said pattern and each of said studs comprises on aluminum-based alloy.

6. The method of claim 5 including the step of blanket coating said substrate pattern and each said stud with silicon nitride between Steps A and B.

7. The method of claim 1 including the step of blanket coating said substrate pattern and each said stud with silicon nitride between Steps A and B.

8. The method of claim 3 wherein the first said etching ambient of step D comprises $CF_4$.

9. The method of claim 8 including the step of blanket coating said substrate pattern and each said stud with silicon nitride between Steps A and B.

10. The method of claim 8 wherein the second said ambient of Step E is a noble gas.

11. The method of claim 10 including the step of blanket coating said substrate pattern and each said stud with silicon nitride between Steps A and B.

12. The method of claim 5 wherein the first said etching ambient of Step D comprises $CF_4$.

13. The method of claim 12 including the step of blanket coating said substrate pattern and each said stud with silicon nitride between Steps A and B.

14. The method of claim 12 wherein the second said ambient of Step E is a noble gas.

15. The method of claim 14 including the step of blanket coating said substrate pattern and each said stud with silicon nitride between Steps A and B.

16. The method of claim 1 wherein said substrate comprises an integrated circuit device.

17. The method of claim 1 wherein said substrate comprises an integrated circuit device.

18. The method of claim 2 wherein said substrate comprises an integrated circuit device.

19. The method of claim 3 wherein said substrate comprises an integrated circuit device.

20. The method of claim 4 wherein said substrate comprises an integrated circuit device.

21. The method of claim 5 wherein said substrate comprises an integrated circuit device.

22. The method of claim 6 wherein said substrate comprises an integrated circuit device.

23. The method of claim 7 wherein said substrate comprises an integrated circuit device.

24. The method of claim 8 wherein said substrate comprises an integrated circuit device.

25. The method of claim 9 wherein said substrate comprises an integrated circuit device.

26. The method of claim 10 wherein said substrate comprises an integrated circuit device.

27. The method of claim 11 wherein said substrate comprises an integrated circuit device.

28. The method of claim 12 wherein said substrate comprises an integrated circuit device.

29. The method of claim 13 wherein said substrate comprises an integrated circuit device.

30. The method of claim 14 wherein said substrate comprises an integrated circuit device.

31. The method of claim 15 wherein said substrate comprises an integrated circuit device.

32. The method of claim 16 wherein said substrate comprises an integrated circuit device.

* * * * *